United States Patent [19]

Akimoto et al.

[11] Patent Number: 5,061,144
[45] Date of Patent: Oct. 29, 1991

[54] RESIST PROCESS APPARATUS

[75] Inventors: Masami Akimoto, Kikuyo; Yoshio Kimura, Kumamoto; Osamu Hirakawa, Kumamoto; Noriyuki Anai, Kumamoto; Masanori Tateyama, Kumamoto; Yasuhiro Sakamoto, Kumamoto, all of Japan

[73] Assignees: Tokyo Electron Limited, Tokyo; Tel Kyushu Limited, Kumamoto, both of Japan

[21] Appl. No.: 442,535

[22] Filed: Nov. 28, 1989

[30] Foreign Application Priority Data

Nov. 30, 1988 [JP] Japan .................... 63-302714
Nov. 30, 1988 [JP] Japan .................... 63-302715
Apr. 28, 1989 [JP] Japan .................... 1-110593

[51] Int. Cl.⁵ .............................................. B25T 5/02
[52] U.S. Cl. .................................... 414/225; 118/500; 198/468.6; 294/32; 414/749; 901/16; 901/30
[58] Field of Search ............. 414/222, 225, 416, 749, 414/751; 198/468.6, 803.14; 901/16, 30, 39; 294/27.1, 32, 1.1; 134/902; 118/500, 635

[56] References Cited

U.S. PATENT DOCUMENTS

| | | | |
|---|---|---|---|
| 4,311,427 | 1/1982 | Coad et al. | 414/225 X |
| 4,433,951 | 2/1984 | Koch et al. | 414/222 X |
| 4,507,078 | 3/1985 | Tam et al. | 432/11 |
| 4,632,624 | 12/1986 | Mirkovich et al. | 414/222 X |
| 4,722,298 | 2/1988 | Rubin et al. | 414/222 X |
| 4,936,328 | 6/1990 | Yatabe | 134/902 X |

FOREIGN PATENT DOCUMENTS

59-86143 5/1984 Japan.
63-3155 1/1988 Japan.

Primary Examiner—Frank E. Werner
Assistant Examiner—Donald W. Underwood
Attorney, Agent, or Firm—Oblon, Spivak, McClelland, Maier & Neustadt

[57] ABSTRACT

A resist process apparatus of the invention serves to load/unload a semiconductor wafer in/from the respective process mechanisms. The apparatus includes a wafer holding member for holding a semiconductor wafer, and X, Y, Z and θ driving mechanisms for conveying the wafer holding member to a resist coating mechanism and the like. The wafer holding member includes a support frame which is larger than diameter of a semiconductor wafer, and a plurality of support members, arranged on the support frame, for supporting the semiconductor wafer in partial contact with the peripheral portion of the semiconductor wafer. Since the contact area between the support members and a semiconductor wafer is small, changes in temperature of the semiconductor, when it is held, are small.

10 Claims, 5 Drawing Sheets

RESIST PROCESS APPARATUS

BACKGROUND OF THE INVENTION

1. Field of the Invention

The present invention relates to a resist process apparatus for performing a resist process of a semiconductor wafer and, more particularly, to a wafer holding mechanism for holding a semiconductor wafer.

2. Description of the Related Art

With an increase in packing density of semiconductor elements, a resist process of a semiconductor wafer is becoming more complicated. For this reason, a resist process apparatus includes a plurality of process mechanisms, such as a mechanism for processing a semiconductor wafer with hexamethyldisilazane (HMDS), a mechanism for coating a resist solution on the wafer, a mechanism for baking the wafer, and a mechanism for performing a developing treatment of the wafer.

In a conventional resist process apparatus, the respective process mechanisms (a plurality of resist coating mechanisms, baking mechanisms, and the like) are arranged in tandem between a loader mechanism and an unloader mechanism, and handling mechanisms for conveying wafers are between the respective process mechanisms. Since the process mechanisms are arranged in a line in this manner, the apparatus cannot respond to changes in process.

In order to eliminate the above-described drawback of the line type resist process apparatus, an improved resist process apparatus disclosed in U.S. application Ser. No. 320,619 and No. 357,279 is designed to have a flexible arrangement as a whole so as to respond to a complicated process or changes in process. In this improved resist process apparatus, a track is arranged, and a handling device is moved within this track so as to select a necessary mechanism from the respective process mechanisms such as coating and baking mechanisms.

The above handling device has a suction arm at a position where a semiconductor wafer is held. However, when a semiconductor wafer is held by suction by the suction arm, dust is accumulated near the suction port, and hence dust tends to adhere to the semiconductor wafer.

In addition, if a resist process apparatus has a complex mechanism, the amount of dust generated from the mechanism is increased, and the interior of a clean room becomes susceptible to contamination. As a result, dust tends to adhere to semiconductor wafers, and the ratio of non-defective semiconductor wafers may be decreased.

In order to eliminate the drawbacks of such a conventional handling device, U.S. Pat. No. 4,507,078 discloses a handling device for holding a semiconductor wafer by using a ring-like member. According to such a handling device, since a semiconductor wafer is held by simply fitting the wafer in the ring-like member, the amount of dust adhering to the semiconductor wafer is greatly decreased.

In the above-described handling device, however, since heat exchange is performed through a contact portion between a semiconductor wafer and the ring-like member, a difference in temperature between the peripheral and central portions of the semiconductor wafer is caused. This may adversely affect the subsequent processes. In a resist process apparatus, since the temperature of a semiconductor wafer varies in an HMDS treatment, resist coating, a developing treatment, and the like, the wafer temperature is adjusted in a pre-process of each treatment. However, since a target temperature in each process may differ from an actual wafer temperature, the wafer temperature in a resist process cannot be accurately managed, thus posing various problems. For example, the thickness of a resist film fails to reach a target thickness.

SUMMARY OF THE INVENTION

It is an object of the present invention to provide a handling device for a resist process apparatus, which can minimize changes in temperature of a wafer during wafer conveyance.

According to an aspect of the present invention, a resist process apparatus wherein semiconductor wafers are sequentially transported and processed by a plurality of process mechanisms on the basis of a program stored beforehand comprising, a wafer holding member for holding the semiconductor wafer, and conveying means for conveying the wafer holding member to the process mechanisms, the wafer holding member including a support frame being larger than diameter of the semiconductor wafer, and a plurality of support members, arranged on the support frame, for supporting the semiconductor wafer in partial contact with a peripheral portion of the semiconductor wafer.

Tapered edges are preferably formed on portions of the support members which abut against a semiconductor wafer. Since the abutment portions are shaped into the tapered edges, the contact area between the support members and the semiconductor wafer is minimized, and changes in temperature of the semiconductor wafer, when it is held, become small. As a result, a uniform resist film can be formed on the entire surface of semiconductor wafer.

Each tapered edge is preferably inclined at 30° to 60°, more preferably, at 45° with respect to a level.

In addition, it is preferable that each support member includes a rectangular bar having a tapered surface, and that a semiconductor wafer is brought into contact with the tapered surface. This tapered surface is preferably inclined at 1° to 20°, more preferably, at 2° with respect to a level.

Moreover, a guide tapered portion is preferably formed on each support member independently of the abutment support portion so as to guide a semiconductor wafer to the abutment support portion.

Each support member is preferably made of a material, which does not easily produced dust, and which has a small thermal conductivity, and is more preferably made of a fluoro resin or a ceramic such as silicon nitride or alumina.

DETAILED DESCRIPTION OF THE PREFERRED EMBODIMENTS

Figure 1:
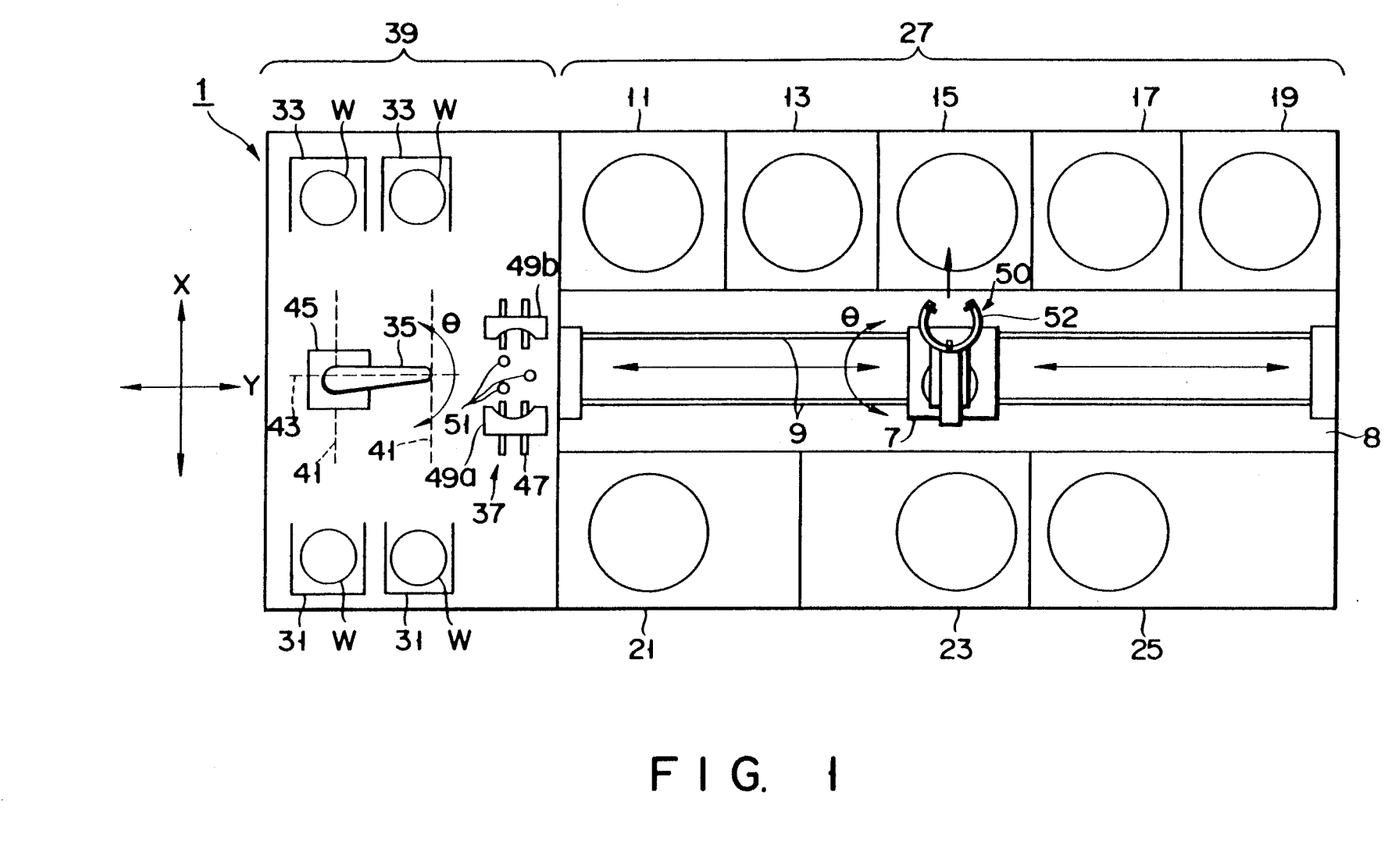
FIG. 1 is a plan view showing a schematic arrangement of an overall resist process apparatus.

Embodiments of the present invention will be described below with reference to the accompanying drawings. As shown in FIG. 1, a resist process apparatus 1 comprises a wafer station (process unit) 27 and a cassette station 39. The operations of the respective units included in both the stations are automatically controlled by a computer system (not shown).

A wafer transfer base 37 is arranged at a rear portion of the cassette station 39. A semiconductor wafer W is transferred from the cassette station 39 to the process unit 27 through the wafer transfer base 37. A track 8 extends from the rear side of the wafer transfer base 37 to the front side of an exposure unit (not shown) through the center of the process unit 27 along the Y axis. Rails 9 are fixed on the track 8, and a robot 7 is mounted on the rails 9. The robot 7 has a moving/handling mechanism for loading/unloading the semiconductor wafer W in/from mechanisms 11, 13, 15, 17, 19, 21, 23, and 25 of the process unit 27.

The cassette station 39 will be described in detail below.

Cassettes 31 which are loaded by a transportation robot (not shown) are placed at standby positions on one side (loading section) of the station 39. Each cassette 31 houses 25 non-processed (before a resist process) wafers W. A plurality of cassettes 33 are placed at standby positions on the other side (unloading section) of the station 39. Each cassette 33 houses processed (after a resist process) semiconductor wafers W.

A suction arm 35 is arranged to be movable between the wafer transfer base 37 and each of the cassettes 31 and 33. The suction arm 35 is supported by an X-axis driving mechanism 41, a Y-axis driving mechanism 43, and a θ-rotation mechanism 45.

The respective cassettes 31 and 33 are supported by lifting mechanisms (not shown), and are vertically moved at the respective standby positions upon interlocking with the suction arm 35. With this interlocking operation, level adjustment between the cassettes 31 and 33 and the suction arm 35 is performed, so that a non-processed wafer W is taken out from the cassette 31 and processed wafer W is returned to the cassette 33 by the suction arm 35.

The wafer transfer base 37 includes guide rails 47, a pair of sliders 49a and 49b, and three support pins 51. The opposite surfaces of the sliders 49a and 49b are curved along the periphery of a wafer W, and formed into a conical shape whose diameter is gradually decreased toward the bottom. The pair of sliders 49a and 49b are caused to slide on the guide rails 47, by a driving motor (not shown), in the opposite directions. That is, when the sliders 49a and 49b are caused to slide, the distance therebetween is increased or decreased.

The three support pins 51 vertically extend downward at intermediate positions between the sliders 49a and 49b, and are designed to be vertically moved by a pin lifting unit (not shown). The pins 51 and the sliders 49a and 49b perform centering (positioning) of the wafer W with respect to the robot 7.

The wafer process station 27 will be described in detail below.

The various process mechanisms are arranged on both the sides of the track 8. On one side of the track 8, the HMDS process mechanism 11, the first pre-bake mechanism 13, the first cooling mechanism 15, the second pre-bake mechanism 17, and the second cooling mechanism 19 are arranged in the order named, from a position near the wafer station 39. On the other side of the track 8, the first coating mechanism 21, the second coating mechanism 23, and the surface coating mechanism 25 are arranged in the order named, from a position near the wafer station 39.

The HMDS process mechanism 11 is used to coat a hydrophilic HMDS solution on the pattern formation surface of a semiconductor wafer W so a to improve the developing performance (adhesion strength) of any resist film. The first pre-bake mechanism 13 serves to heat/evaporate any residual solvent in a first resist layer coated on the wafer W. The first cooling mechanism 15 serves to cool the wafer W which is heated by the first pre-bake mechanism 13. The second pre-bake mechanism 17 serves to heat of any residual solvent in a second resist layer.

The first and second coating mechanisms 21 and 23 serve to perform spin coating of the first and second resist layers, respectively. The surface coating mechanism 25 is used to coat/form a surface coating layer, such as a CEL film, on a previously-coated resist film.

The robot 7 will be described below.

The robot 7 includes a handling mechanism having a wafer holding portion 50. The wafer holding portion 50 is mounted on X-, Y-, Z-, and θ-tables. The X-, Y-, and Z- tables are respectively coupled to ball screws which are driven by stepping motors, and are designed to be movable along linear guides. The θ-table is coupled to a shaft which is driven by a stepping motor. The θ-table is placed on the Y-table, and the wafer holding portion 50 is rotated through 360° by the θ-table. In addition, the X- and Z-tables are placed on the θ-table so that the wafer holding portion 50 is moved in the X direction by the X-table, and is moved in the Z direction (vertical direction) by the Z-table.

Figure 2:
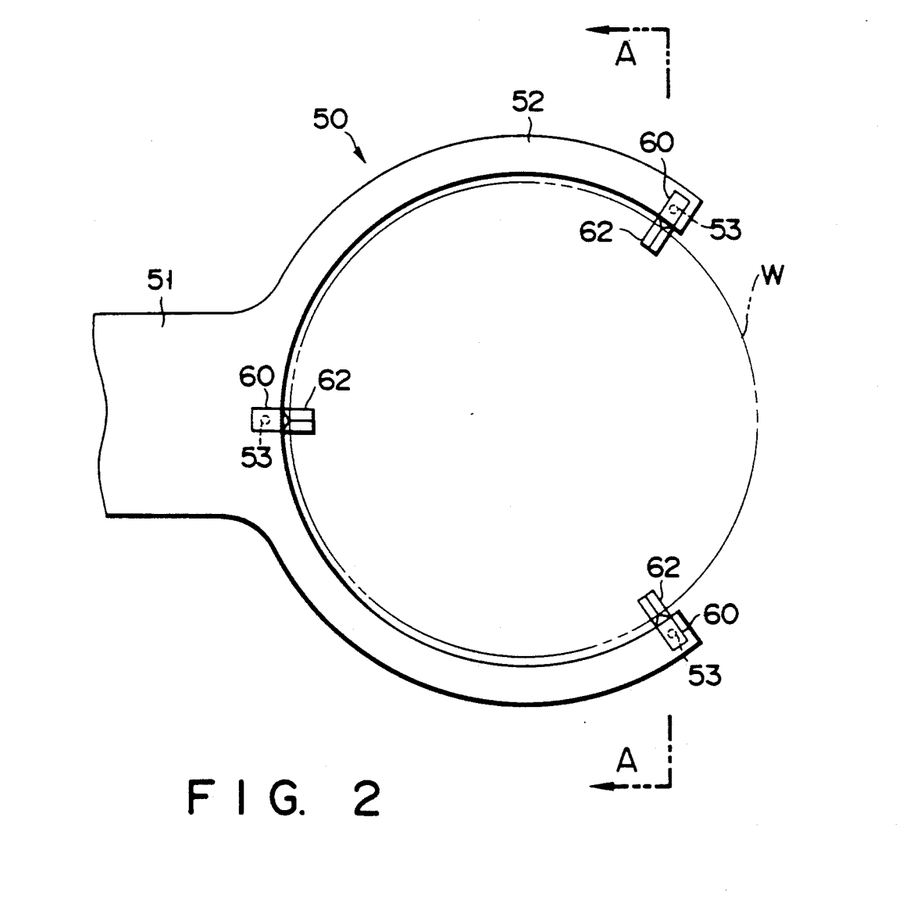
FIG. 2 is an enlarged plan view showing a wafer holding member of a handling device arranged in a resist process apparatus according to the first embodiment of the present invention.

As shown in FIG. 2, a ring-like support frame 52 is formed at the distal end of an arm 51 of the wafer holding portion 50 of the first embodiment. The support frame 52 has an inner diameter slightly larger than the diameter (e.g., 6 inches) of a wafer W. The distal end portion of the support frame 52 is notched within a range of about 90 mm (72°). The support frame 52 is constituted by, e.g., an aluminum plate.

Three pawl-like support members 60 are attached to the support frame 52 at substantially equal intervals so as to cause support portions 62 formed at their distal ends to respectively protrude inwardly from the support frame 52. These support portions 60 are preferably made of a material, which does not easily produce dust, and which has a small thermal conductivity. For example, the support member 60 is made of a fluoro resin.

Figure 3:
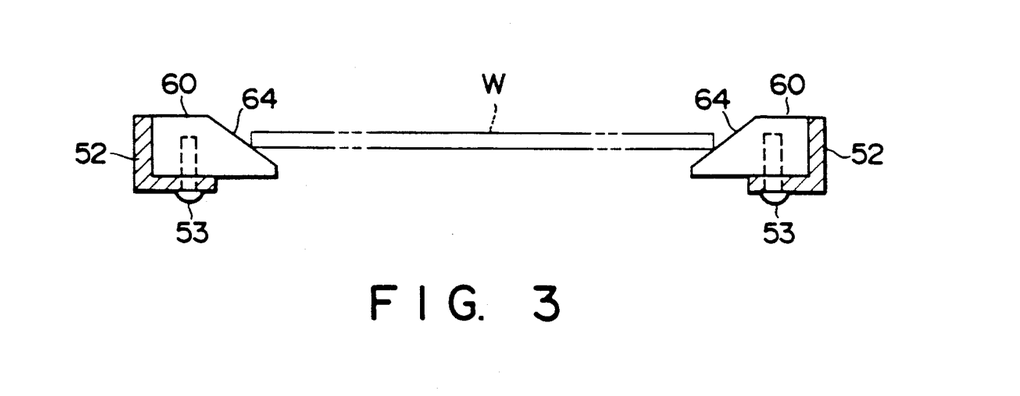
FIG. 3 is a longitudinal sectional view (taken along a line A—A in FIG. 2) of the wafer holding member viewed from its side.

As shown in FIG. 3, each support member 60 is fastened to the support frame 52 with a screw 53 inserted from the lower surface of the support frame 52.

Figure 4:
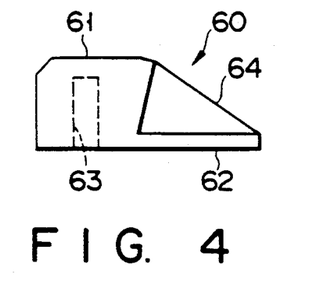
FIG. 4 is a view showing a pawl-like projection member for holding a wafer according to the first embodiment.
Figure 5:
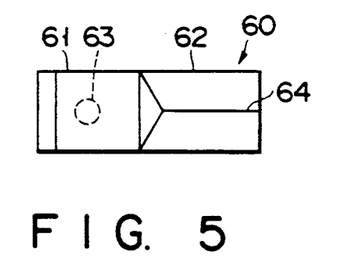
FIG. 5 is a plan view of the pawl-like projection member for holding a wafer according to the first embodiment.

The support portions 62 of the support members 60 will be described in detail below with reference to FIGS. 4 and 5. A tapered edge 64 is formed on the upper portion of each support portion 62. The tapered edge 64 is inclined downward toward its distal end. The inclination angle of the edge 64 is 2°. Note that a screw hole 63 is formed in a base portion 61 of each support member 60.

A case wherein a resist process of a semiconductor wafer W is performed by using above-described device will be described below.

(I) The suction arm 35 is positioned below one wafer cassette 31, and the cassette 31 is lowered to allow the suction arm 35 to hold the lowermost semiconductor wafer W by suction. The suction arm 35 is then moved in the X-axis direction so as to take out the semiconductor wafer W from the cassette 31. After the suction arm 35 is rotated through 90°, it is moved in the Y-axis direction, and the semiconductor wafer W is placed on the transfer base 37. At this time, the semiconductor wafer W is placed on the base 37 such that the orientation flat (O.F.) of the wafer W is located opposite to the track 8 (on the cassette station 39 side).

(II) The three pins 51 are raised, and the distance between the pair of the sliders 49a and 49b is decreased, thus the semiconductor wafer W is centered to the robot 7. After centering, the robot 7 is moved toward the transfer base 37, and the support frame 52 of the wafer holding portion 50 is positioned below the semiconductor wafer W. The Z-table is raised to cause the support frame 52 to lift the wafer W from the pins 51. The wafer W is supported by the support members 60 at the three points. In this case, since the center of the wafer W on the base 37 is matched with that of the wafer holing portion 50, as shown in FIG. 3, the wafer W slides in the support frame 52 along the edges 64 of the support members 60 and is accurately held in a horizontal state.

(III) The robot 7 is moved in the Y-axis direction so as to be positioned in front of the HMDS process mechanism 11. After the wafer holding portion 50 is rotated through 90°, it is subsequently moved in the X-axis direction, and is lowered to transfer the wafer W onto the reception base (not shown) of the mechanism 11.

(IV) The support frame 52 of the wafer holding portion 50 is withdrawn from the mechanism 11, and the wafer W is performed an HMDS treatment. After the treatment, the support frame 52 is inserted in the mechanism 11 to take out the wafer W therefrom.

(V) The wafer holding portion 50 is rotated through 180° to position the wafer W held by the support frame 52 in front of the first coating mechanism 21. The wafer holding portion 50 is moved in the X-axis direction and is lowered to transfer the wafer W onto the reception base of the first coating mechanism 21.

(VI) The support frame 52 of he wafer holding portion 50 is withdrawn from the mechanism 21, and a resist solution is coated on the wafer W. After coating, the support frame 52 is inserted in the mechanism 21 to take out the wafer W therefrom. The robot 7 is moved in the Y-axis direction so as to be positioned in front of the first pre-bake mechanism 13.

(VII) The wafer holding portion 50 is rotated through 180° so as to extend in the X-axis direction, thus transferring the wafer W onto the reception base of the mechanism 13. The wafer W is heated to a predetermined temperature in the mechanism 13. After baking, the wafer W is taken out from the mechanism 13. Since the area of the contact portion between the wafer W and the support members 60, when the wafer W is held, is very small (support at the three points), almost no variation in temperature of the wafer W substantially occurs.

(VIII) A predetermined resist film is formed on the pattern formation surface of the wafer W by causing the robot 7 to travel on the rails 9 so as to move the wafer W to the mechanisms 11, 21, 13, 15, 23, 17, 19, and 25 in this order, as described above.

(IX) After a surface layer coating treatment of the wafer W is finally performed by the mechanism 25, the robot 7 is moved in the Y-axis direction so as to transfer the processed wafer W onto the transfer base 37. After centering of the wafer W is performed on the base 37, the wafer W is held by the suction arm 35 by suction. The suction arm 35 is then subjected to Y-axis movement, θ rotation, X-axis movement, and Z-axis movement so that the processed wafer W is housed in a corresponding wafer cassette 33 on the unloading section.

According to the first embodiment, since the wafer W is supported by the tapered edges 64 of the support portions 62 at the three points, the area of the contact portion between the wafer W and the support members 60 becomes very small. For this reason, even if there is a temperature difference of 70° to 80° between the wafer W and the holding portion 50, as is after a baking treatment, changes in temperature of the wafer W before/after it is held can be suppressed to fall within a range of ±0.3° C. As a result, a uniform resist film can be obtained without causing non-uniform coating.

In addition, according to the first embodiment, since pre-alignment (centering) of the semiconductor wafer W with respect to the wafer holding portion 50 can be performed on the wafer transfer base 37, the support members 60 are smoothly brought into contact with the semiconductor wafer W without resistance. Hence, the semiconductor wafer W is free from damage.

Moreover, since the semiconductor wafer W slides in the support frame 52 along the tapered edges 64 of the support members 60, centering of the wafer W can be performed with higher precision.

Figure 7:
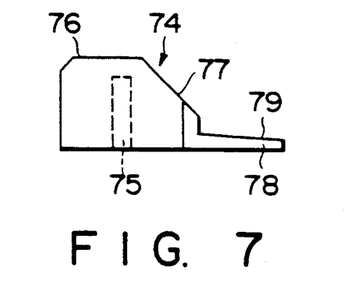
FIG. 7 is a view of a pawl-like projection member for holding a wafer according to the second embodiment, which is viewed from its side.
Figure 8:
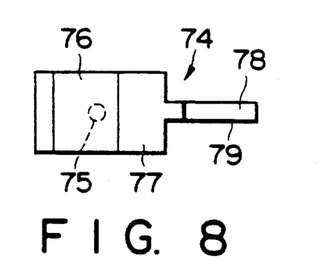
FIG. 8 is a plan view of the pawl-like projection member for holding a wafer according to the second embodiment.

The second embodiment of the present invention will be described below with reference to FIGS. 6 to 8. Note that a description and illustration of parts common to the first and second embodiments will be omitted.

Figure 6:
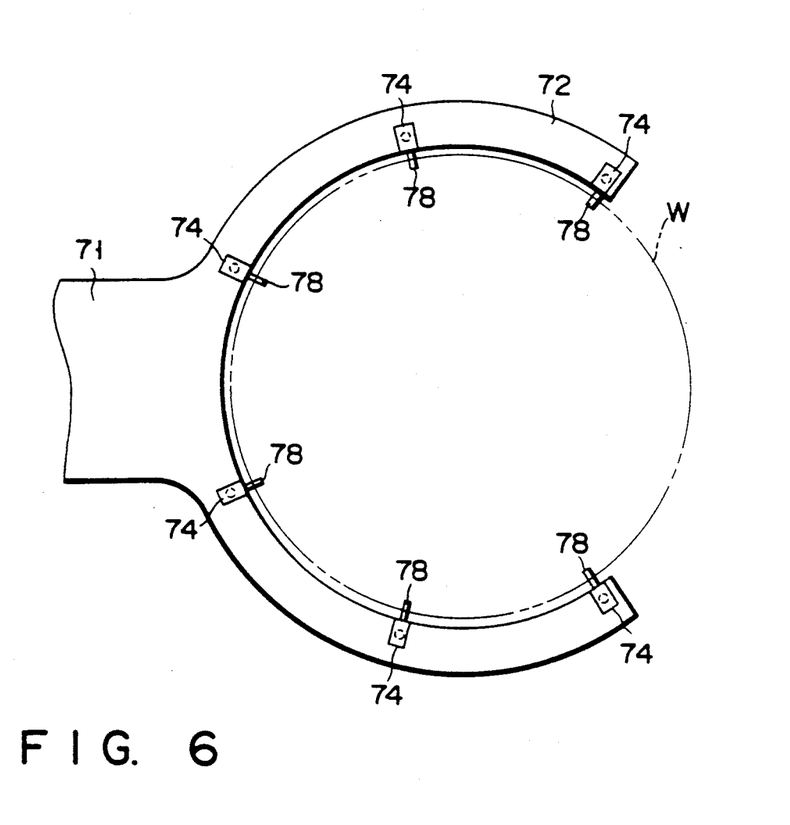
FIG. 6 is an enlarged plan view showing a wafer holding member of a handling device arranged in a resist process apparatus according to the second embodiment of the present invention.

As shown in FIG. 6, a ring-like support frame 72 is formed at the distal end of an arm 71 of a wafer holding member 70 of the second embodiment. The support frame 72 has an inner diameter slight larger than the diameter (e.g., 6 inches) of a wafer W. The distal end portion of the support frame 72 is notched within a range of about 90 mm (72°). This support frame 72 is constituted by, e.g., an aluminum plate.

Six pawl-like support members 74 are fixed to the support frame 72 at substantially equal intervals such that support portions 78 formed at their distal ends extend inward from the support frame 72. These support member 74 are made of a ceramic materials, such as alumina or silicon nitride.

The support members 74 will be described in detail below with reference to FIGS. 7 and 8. Each support member 74 has a base portion 76, a tapered portion 77, and the support portion 78. A screw hole 75 is formed in the base portion 76. A screw (not shown) is screwed in the screw hole 75 so as to fasten the support member 74 to the support frame 72. The length of one side of the base portion 76 is several millimeters.

The guide tapered portion 77 is formed between the base portion 76 and the support portion 78, and is inclined downward toward its distal end. In this case, the inclination angle of the guide tapered portion 77 is 45°.

The support portion 78 is a rectangular bar having a width of 1 mm and a length of 5 mm. An upper surface 79 of the support portion 78 is tapered to be inclined downward. The inclination angle of the support portion 78 preferably falls within a range of 1° to 3°, more preferably, is set to be 2°.

According to the apparatus of the second embodiment, the wafer W is guided along the tapered portions 77 and drops onto the support portions 78, so that the wafer W is supported in contact with parts of the support portions 78. Therefore, the wafer W can be reliably held in a horizontal state, and positioning of the wafer W, when it is loaded to each mechanism, can be facilitated.

In addition, according to the device of the second embodiment, since the six support members 74 are fixed to the support frame 72, even a wafer W having an orientation flat (O.F.) can be reliability held regardless of the direction of the O.F.

Figure 10:
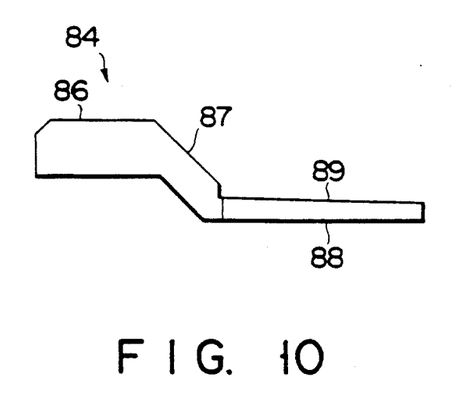
FIG. 10 is a view of a pawl-like projection member for holding a wafer according to the third embodiment, which is viewed from its side.
Figure 11:
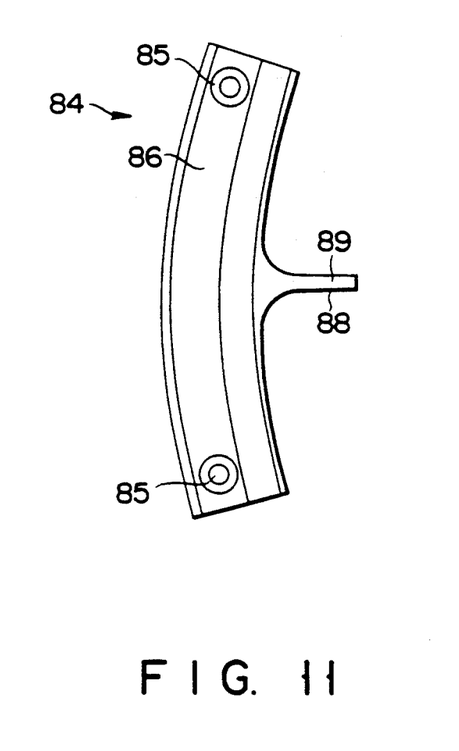
FIG. 11 is a plan view of the pawl-like projection member for holding a wafer according to the third embodiment.

The third embodiment of the present invention will be described below with reference to FIGS. 9 to 11. Note that a description and illustration of parts common to the first and third embodiments will be omitted.

Figure 9:
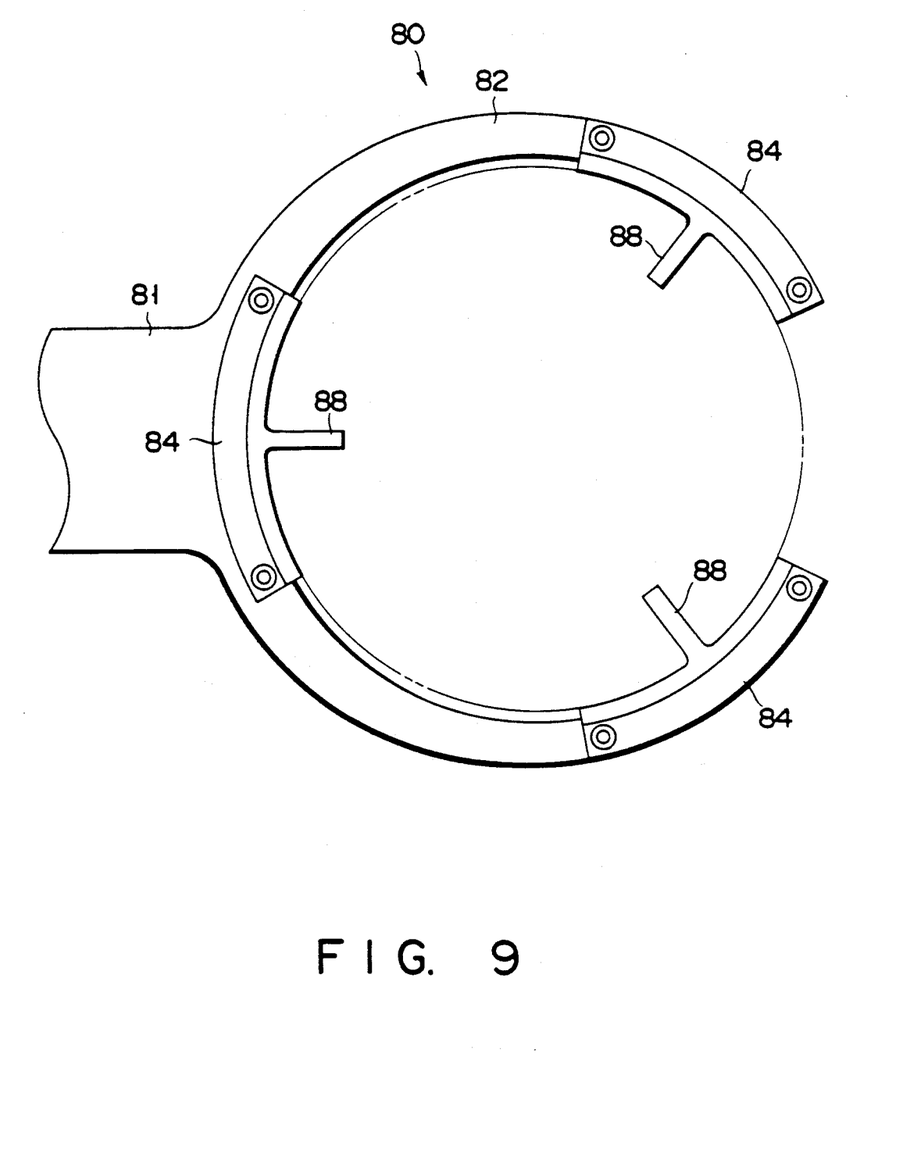
FIG. 9 is an enlarged plan view showing a wafer holding member of a handling device arranged in a resist process apparatus according to the third embodiment of the present invention.

As shown in FIG. 9, three support members 84 are fixed to the support frame 82 at substantially equal intervals such that support portions 88 formed at their distal ends extend inward from the support frame 82. These support member 84 are made of a fluoro resin.

The support members 84 will be described in detail below with reference to FIGS. 10 and 11. Each support member 84 has a long base portion 86, a guide tapered portion 87, and the support portion 88. Two screw holes 85 are formed in the base portion 86. A screw (not shown) is screwed in the each of hole 85 so as to fasten the support member 84 to the support frame 82.

The guide tapered portion 87 is formed between the base portion 86 and support portion 88, and is inclined downward toward its distal end.

In the first, second and third embodiments, one wafer holding member is mounted on the robot 7. However, the present invention is not limited to this. A pair of upper and lower wafer holding members may be mounted on one robot so that a wafer W can be loaded in a process mechanism by one wafer holding member, and a processed wafer W can be simultaneously unloaded from the process mechanism by the other wafer holding member. By arranging upper and lower wafer holding members in a robot handling device, a resist process can be more quickly performed.

The effects of the present invention will be generally described below.

According to the handling device of the present invention, even if the difference in temperature between the wafer holding member and a semiconductor wafer W is large, as is after a baking treatment, changes in temperature of the semiconductor wafer W, before-/after it is held, can be greatly suppressed. For this reason, a uniform resist film can be formed on the semiconductor wafer W without causing non-uniform resist coating.

In addition, according to the handling device of the present invention, since the contact area between the support members and a semiconductor wafer is decreased as compared with a conventional handling device, the amount of dust adhering to the semiconductor wafer is reduced.

Moreover, since pre-alignment (centering) of a semiconductor wafer W with respect to the wafer holding member can be performed on the wafer transfer base, the support members are smoothly brought into contact with the semiconductor wafer W. Hence, the wafer W is free from damage.

Since the device of the present invention has the various effects as described above, reliability of the overall resist process can be greatly improved, and productivity of semiconductor wafers can also be improved.

What is claimed is:

1. A resist process apparatus wherein semiconductor wafers are sequentially transported and processed, comprising:

a plurality of resist processing units for processing the wafers at various temperatures on a basis of a program stored beforehand;

conveying means for conveying the wafers to the respective processing units, the conveying means not being included in any of the resist processing units, and controlled by the program stored beforehand;

the conveying means comprising:

a wafer holder including a support frame and a plurality of support members, for holding each wafer at a level; and moving means for moving the wafer holder;

the support frame being larger than the wafer, the support members being arranged on the support frame, for supporting the wafer at the periphery of the wafer in partial contact with the support members, the support members each having first and second tapered portions to be brought into contact with the wafer, the tapered portions being made of a material having a thermal conductivity lower than metals;

wherein the second tapered portion has a smaller inclination than the first tapered portion, the second tapered portion being arranged on a radially inner side with respect to the first tapered portion.

2. The apparatus according to claim 1, wherein three support members are arranged on said support frame at substantially equal intervals.

3. The apparatus according to claim 1, wherein six support members are arranged on said support frame at substantially equal intervals.

4. The apparatus according to claim 1, wherein said first tapered portion is formed on said support member independently of the second tapered portion, to which the semiconductor is brought into contact, so as to guide the semiconductor wafer to the second tapered portion.

5. The apparatus according to claim 1, wherein said support frame comprises a partially-notched ring.

6. The apparatus according to claim 1, wherein the moving means comprises X, Y, and Z drive mechanisms for moving the wafer holder in X, Y, and Z directions, respectively, and a $\theta$ drive mechanism for rotating the wafer holding assembly in a horizontal plane.

7. The apparatus according to claim 1, wherein the tapered portions of each of the support members are made of a fluoro resin.

8. The apparatus according to claim 1, wherein the wafer holder holds only one of the wafers at a time, and the conveying means transfers the wafers one by one to the processing unit.

9. The apparatus according to claim 1, wherein a stepped portion is formed between the first and second tapered portions.

10. The apparatus according to claim 1, wherein the first tapered portion inclines relative to a horizontal plane at an angle falling within a range of 30°–60°, and the second tapered portion inclines relative to the horizontal plane at an angle falling within a range of 1°–20°.

* * * * *